(12) United States Patent
Joos et al.

(10) Patent No.: US 9,971,374 B2
(45) Date of Patent: May 15, 2018

(54) HV MOS LEAKAGE COMPENSATION FOR ULTRALOW CURRENT OPERATION

(71) Applicant: SEMICONDUCTOR COMPONENTS INDUSTRIES, LLC, Phoenix, AZ (US)

(72) Inventors: Dieter Joos, Kapelle-op-den-Bos (BE); Johan Camiel Julia Janssens, Asse (BE)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 279 days.

(21) Appl. No.: 15/148,140

(22) Filed: May 6, 2016

(65) Prior Publication Data
US 2017/0177018 A1  Jun. 22, 2017

Related U.S. Application Data

(60) Provisional application No. 62/270,891, filed on Dec. 22, 2015.

(51) Int. Cl.
*G05F 3/04*  (2006.01)
*G05F 3/24*  (2006.01)
*H03K 17/12* (2006.01)

(52) U.S. Cl.
CPC ........... *G05F 3/242* (2013.01); *H03K 17/122* (2013.01)

(58) Field of Classification Search
CPC .............................. G05F 3/242; H03K 17/122
See application file for complete search history.

(56) References Cited

U.S. PATENT DOCUMENTS

| | | | |
|---|---|---|---|
| 2006/0055450 A1 | 3/2006 | Gu | |
| 2013/0265020 A1* | 10/2013 | Krenzke | ............ G05F 1/56 323/273 |

* cited by examiner

*Primary Examiner* — Adolf Berhane
*Assistant Examiner* — Afework Demisse
(74) *Attorney, Agent, or Firm* — Ramey & Schwaller, LLP

(57) ABSTRACT

Various disclosed leakage compensation apparatus and methods enable HV MOS transistors to be employed for ultralow current operation. One illustrative embodiment is a backup energy block that includes: a pair of input terminals that couple to a backup energy source; an anti-series switch that supplies power from the pair of input terminals to a voltage regulator (when closed) and isolates power from the pair of input terminals to the voltage regulator (when open); a control current source; and an HV MOS control transistor that selectively couples the control current source to a control signal line to open and close the anti-series switch; and a compensation current source coupled to the control signal line to provide a compensation current matched to a parasitic leakage current from the control transistor. The compensation current source includes an HV MOS compensation transistor matched to the control transistor.

20 Claims, 3 Drawing Sheets

HV MOS LEAKAGE COMPENSATION FOR ULTRALOW CURRENT OPERATION

CROSS-REFERENCE TO RELATED APPLICATION

This application claims priority to U.S. Provisional Application No. 62/270,891, filed on Dec. 22, 2015, entitled "HV MOS LEAKAGE COMPENSATION FOR ULTRALOW CURRENT OPERATION," invented by Dieter JOOS and Johan Camiel Julia JANSSENS, and is incorporated herein by reference and priority thereto for common subject matter is hereby claimed.

BACKGROUND

Transistors, and in particular, metal-oxide-semiconductor ("MOS") field-effect transistors, offer many desirable switch characteristics. Nevertheless, some of their characteristics may render their usage problematic in certain contexts. In particular, the manufacturing process for MOS transistors produces internal junctions between p-type and n-type silicon, yielding parasitic diodes that, when used in such contexts, must be taken into account.

Often, the circuitry employing such transistors is designed to short out such parasitic diodes or to maintain them under reverse bias. Even under reverse bias, however, parasitic diodes exhibit a leakage current. This leakage current can be particularly significant for high voltage ("HV") MOS transistors, which generally have wider channels and enlarged drain dimensions relative to conventional MOS transistors, resulting in increased PN junction areas and increased injection currents. HV MOS transistors may also suffer from significant sub-threshold current flow. Both the parasitic and sub-threshold currents are temperature-dependent. Such leakage currents may prevent HV MOS transistors from being employed for ultralow current operations, despite their general desirability for their ability to operate at elevated voltages and temperatures.

SUMMARY

As used herein, the phrase "ultralow current operation" indicates that a device's overall current consumption is minimized, e.g., maintained below 10 µA, or in some cases less than 1 µA, when placed in a passive mode. Such strict limits may require that individual signal currents be kept at a fraction of this limit, e.g., about 100-250 nA. However, the HV MOS transistor leakage currents may be comparable to, or even greater than, currents in this range. Accordingly, there are disclosed herein various leakage compensation apparatus and methods that may enable HV MOS transistors to be employed for ultralow current operation.

One illustrative control device embodiment includes a control current source; an HV MOS control transistor; and a compensation current source. The HV MOS control transistor selectively couples the control current source to a control signal line, but also couples a parasitic leakage current to the control signal line. The compensation current source uses an HV MOS compensation transistor to provide a compensation current to match the parasitic leakage current.

One illustrative method embodiment includes: (a) selectively coupling a control current source to a control signal line with an HV MOS control transistor that further couples a parasitic leakage current to the control signal line; and (b) compensating for the parasitic leakage current with a compensation current source having an HV MOS compensation transistor that matches the compensation current to the parasitic leakage current.

One illustrative system embodiment is a backup energy block that includes: a voltage regulator coupled to a pair of output terminals; a pair of input terminals that couple to a backup energy source; an anti-series switch that supplies power from the pair of input terminals to the voltage regulator (when closed) and isolates power from the pair of input terminals to the voltage regulator (when open); a control current source; and a high-voltage metal-oxide-semiconductor ("HV MOS") control transistor that selectively couples the control current source to a control signal line to open and close the anti-series switch; and a compensation current source coupled to the control signal line to provide a compensation current matched to a parasitic leakage current from the control transistor. The compensation current source includes an HV MOS compensation transistor matched to the control transistor.

Each of the foregoing embodiments may include one or more of the following elements in any combination: (1) The compensation transistor has a floating source shorted to its gate. (2) the control transistor and the compensation transistor are part of a crossed-quad configuration to provide better matching. (3) Both the control and compensation transistors are enhancement mode n-type HV MOS transistors. (4) The current supplied by the control current source has a magnitude less than 250 nA. (5) The selective coupling includes isolating the control current source from the control signal line for an active mode, and coupling the control current source to the control signal line for a passive mode. (6) The control signal line controls an anti-series switch, opening the switch for the passive mode and closing it for the active mode. (7) When closed, the power switch supplies power from a backup energy source to a voltage regulator. (8) A diode or other level shifting component is coupled between the control signal line and the compensation current source.

It should be understood that the drawings and corresponding detailed description do not limit the disclosure, but on the contrary, they provide the foundation for understanding all modifications, equivalents, and alternatives falling within the scope of the appended claims.

DETAILED DESCRIPTION

Figure 1:
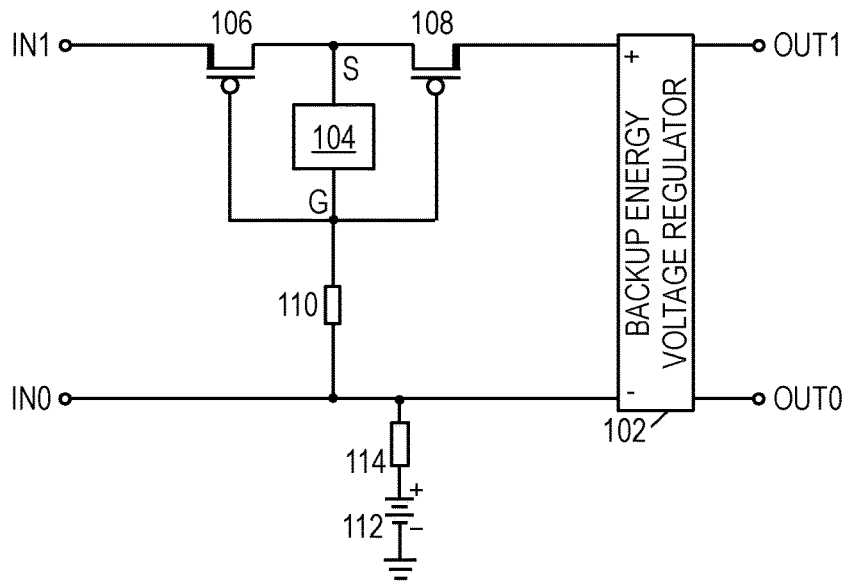
FIG. 1 is a schematic of an illustrative backup energy block.

FIG. 1 is a schematic of an illustrative backup energy block having a voltage regulator 102 that, when enabled, draws power from a backup energy source via a pair of input terminals, IN1 and IN0, to supply a regulated voltage on output terminals OUT1 and OUT0. The power draw is enabled by a switch control device 104 which closes an anti-series switch (shown in FIG. 1 as back-to-back HV MOS transistors 106, 108 having a common source node, S) coupled between the input terminal IN1 and the positive input of the voltage regulator. Input terminal IN0 is directly coupled to the negative input of the voltage regulator. A biasing resistor 110 couples the anti-series switch's gate node, G, to input terminal IN0. The switch control device 104 opens the anti-series switch by driving the gate-source voltage, $V_{GS}$, to zero, and closes the switch with a negative $V_{GS}$. FIG. 1 further shows an equivalent voltage source 112 and impedance 114 to represent variation of input terminal IN0 relative to the local ground node.

In some embodiments, voltage regulator 102 is a single-ended primary-inductor converter (SEPIC) capable of operating in a burst ("charging") mode to recharge a capacitor coupled to the output terminals from about 11 V to about 15 V from an input voltage ranging from 2 to 40 V, while consuming no more than about 1 mW. Once the output capacitor has been charged to a desired voltage range, the converter enters a low-power ("discharging") mode where it passively monitors the output capacitor voltage while consuming minimal power. The cycling of the enabled voltage regulator 102 between charging and discharging modes represents the active mode of the backup energy block, which is invoked when the main system has lost power.

In contrast, when the main system is receiving power from another source, the backup energy block enters a passive mode in which the voltage regulator 102 is disabled by the switch control device 104 opening the anti-series switch (transistors 106, 108). In the passive mode, the current draw of the backup energy block should be minimized, e.g., limited to the micro-amp range or below.

Figure 2:
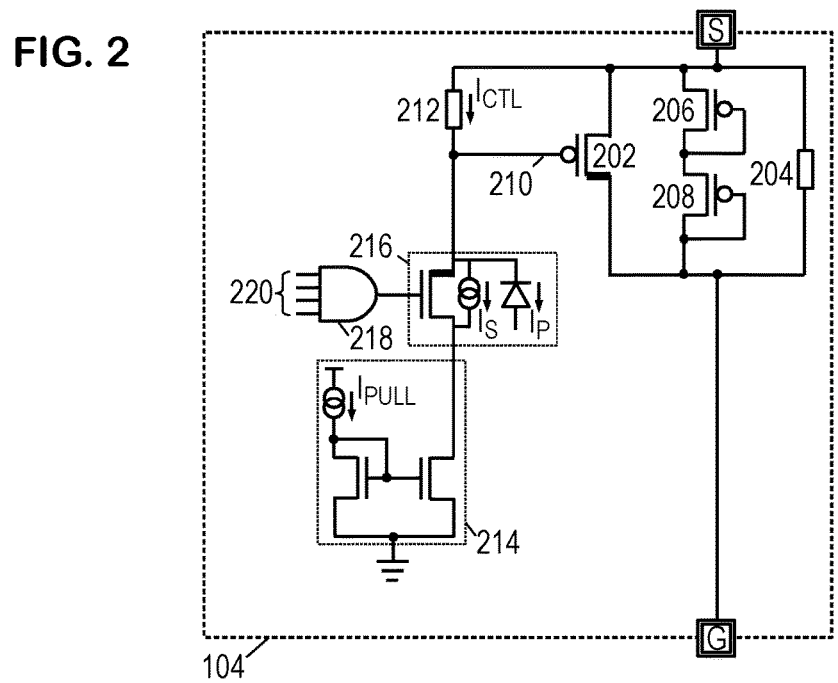
FIG. 2 is a schematic of an illustrative switch control device that does not support ultralow current operation.

FIG. 2 shows a first illustrative embodiment of switch control device 104 having a shunt transistor 202 that, when ON, drives $V_{GS}$ to zero. When shunt transistor 202 is OFF, it enables the biasing current (FIG. 1, resistor 110) to develop a negative $V_{GS}$ across resistor 204. A cascaded pair of diode-configured transistors 206, 208 is optionally provided in parallel with resistor 204 to limit $V_{GS}$ to about twice the threshold voltage, i.e., $-2 V_{GS}$, to prevent damaging the anti-series switch transistors 106, 108. The gate voltage signal supplied to the shunt transistor 202 thus controls the switch state and thereby determines whether the voltage regulator is enabled or disabled. The conductor transporting this gate voltage signal is hereafter termed the control signal line 210.

Because the input terminal IN0 is permitted to float relative to the local ground, the control signal line 210 is preferably current-driven, i.e., the control signal is specified in terms of a current rather than in terms of a voltage. A resistor 212 converts the control current $I_{CTL}$ into a suitable gate voltage for controlling the shunt transistor 202. A control current source 214 sets the control current $I_{CTL}$ at a desired pull-down current value, and a control transistor 216 selectively couples the control current source 214 to the control signal line 210.

The various circuit parameters are preferably set so that when the control transistor 216 couples the control current source 214 to the control signal line 210, a negative $V_{GS}$ develops across resistor 212, causing the shunt transistor 202 to drive the anti-series switch $V_{GS}$ to zero, preventing power from reaching the voltage regulator 102 from the input terminals IN0, IN1. Further, when the control transistor 216 decouples the control current source 214 from the control signal line 210, the shunt transistor 202 opens, enabling a negative $V_{GS}$ to develop across resistor 204, enabling the voltage regulator 102 to draw power from the input terminals IN0, IN1.

The illustrated control transistor 216 is an n-type HV MOS, such that when its gate signal is asserted, the voltage regulator 102 is disabled ("passive mode") and when the gate signal is de-asserted, the voltage regulator 102 is enabled ("active mode") as set forth above. The gate signal for control transistor 216 may thus be referred to as the passive mode signal, holding the backup energy block in passive mode while it is asserted. Advantageously, when the control device 104 loses power, the passive mode signal (as well as the control current source 214) fails, causing the backup energy block to automatically become active and supply regulated power to the output terminals OUT0, OUT1.

In the illustrated embodiment, a logical AND gate 218 derives the passive mode signal from a group of inverted trigger signals 220. The inverted trigger signals are each ON by default, and OFF when indicating the necessity for entering active mode. Thus, when any one or more of the inverted trigger signals falls, the passive mode signal is de-asserted and the voltage regulator 102 is enabled. The trigger signals may indicate detected or anticipated faults with main system power (e.g., voltage loss, excessive noise) or manual mode control.

Also shown in FIG. 2 are sources of parasitic leakage current in the HV MOS control transistor 216. A current source represents a sub-threshold leakage current $I_S$, and a diode represents a parasitic leakage current $I_P$ caused by a parasitic substrate-to-drain diode common to most HV MOS transistors. (In many double-diffused MOS ("DMOS") structures suitable for HV applications, the drain is coupled to a buried diffusion layer having a doping type opposite that of the substrate.) Both currents $I_S$, $I_P$ are temperature dependent and subject to voltage variation on the input terminals IN0, IN1 relative to the local ground node. Nevertheless, so long as the control current $I_{CTL}$ is an order of magnitude larger than the leakage currents, the illustrated switch control device 104 may be expected to operate reliably.

However, when it is necessary to reduce the control current $I_{CTL}$ to a fraction of a micro-amp, the leakage current may prevent the control transistor 216 from influencing the control signal line voltage enough to place the backup energy block in the active mode when the passive mode signal is de-asserted. Some form of leakage current compensation is desirable.

Figure 3:
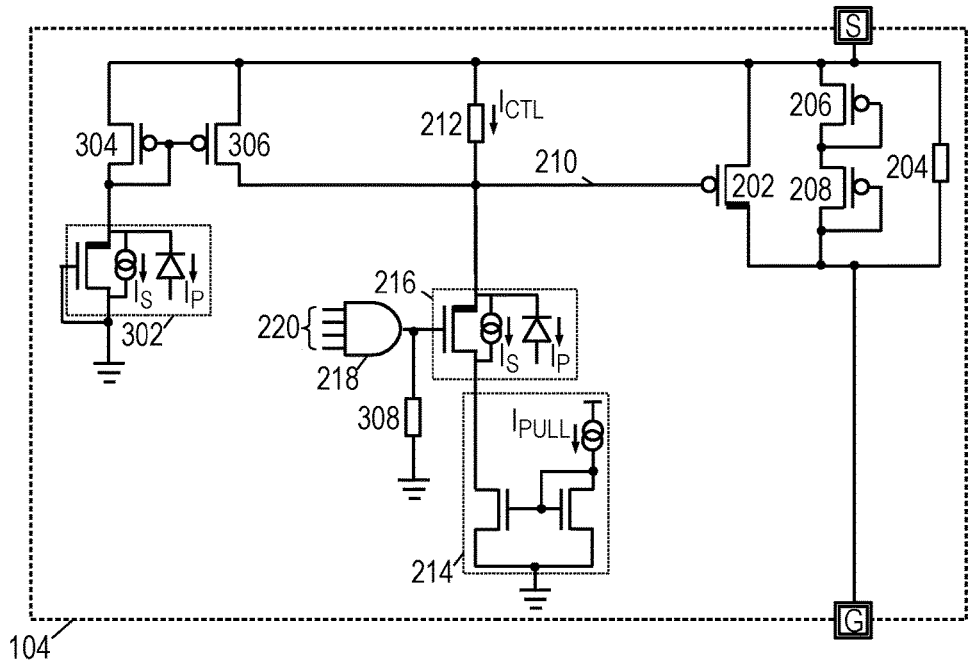
FIG. 3 is a schematic of an illustrative switch control device employing a flawed compensation technique.

FIG. 3 shows a naïve compensation approach that employs a compensation transistor 302 matched to the control transistor 216. Thus, in this embodiment, both transistors are n-type enhancement mode HV MOS transistors, preferably in close proximity with similar dimensions so as to have similar leakage currents $I_S$, $I_P$ when their gate signals are de-asserted. (It is when the passive mode signal is de-asserted that the leakage currents of control transistor cause a problem.) The compensation transistor's gate and source terminals are tied to ground, and the resulting leakage currents are used to set a compensation current flow via a current mirror formed by transistors 304, 306. Thus components 302-306 form a compensation current source. The compensation current is supplied to the control signal line 210, essentially canceling out the leakage currents of control transistor 216.

However, careful consideration of FIG. 3 reveals that the pull-down current $I_{PULL}$ subsumes the sub-threshold leakage current $I_S$ when the control transistor is ON. If the sub-threshold leakage in the compensation transistor 302 becomes comparable to the pull-down current $I_{PULL}$ (as may happen at elevated temperature), the compensation current essentially suppresses the control current $I_{CTL}$ and prevents the control transistor 216 from influencing the control signal line voltage enough to place the backup energy block in the passive mode when the passive mode signal is asserted. In other words, the control signal line voltage becomes independent of the control transistor state and the backup energy block is kept in the active mode.

Figure 4A:
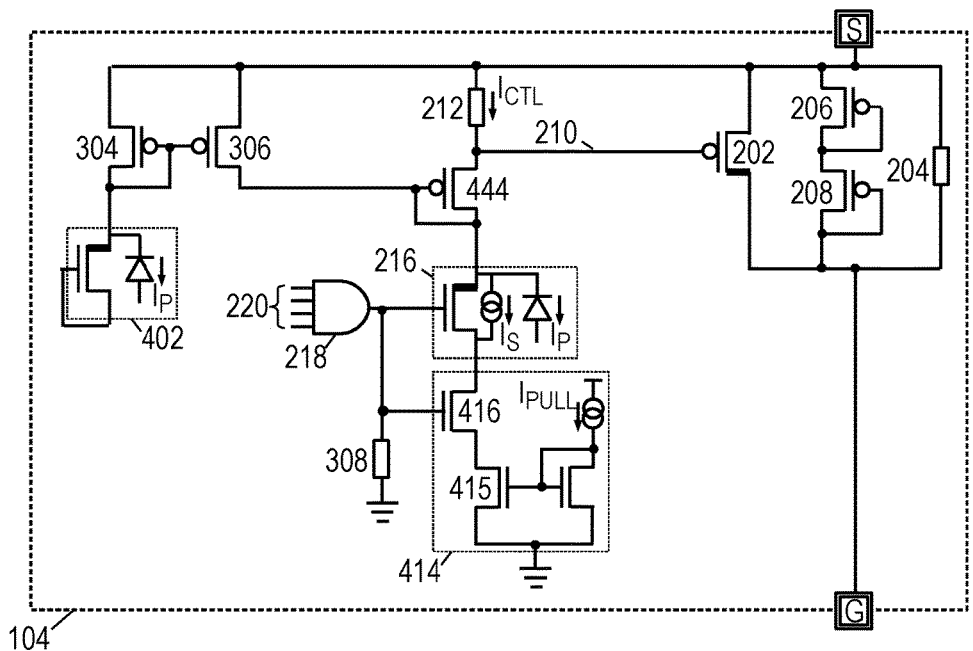
FIG. 4A is a schematic of an illustrative switch control device employing a novel compensation technique.

Accordingly, FIG. 4A shows an illustrative embodiment of control device 104 that employs a novel compensation approach. In FIG. 4A, the compensation transistor 402 has a source that is shorted to the gate, but is otherwise left floating. In this configuration, the compensation transistor 402 still has a body diode with a parasitic leakage current $I_P$, but does not have a path that allows a sub-threshold current to flow. Thus, the compensation current source formed by components 402, 304, 306, supplies a compensation current that matches the parasitic leakage current $I_P$, but omits the sub-threshold leakage current $I_S$. In all other respects, the compensation transistor is preferably matched to control transistor 216, i.e., both transistors are n-type enhancement mode HV MOS transistors in close proximity with similar dimensions so as to have similar parasitic leakage currents $I_P$ when their gate-source voltage $V_{GS}$ is zero.

To ensure that transistor 306 has adequate headroom to properly source the compensation current, it is coupled to the control signal line 210 via a diode-configured transistor 444, a diode, or any other component that provides a voltage level shift between the control signal line 210 and the output of the compensation current source. Even at very low currents, transistor 444 is able to maintain the current source output voltage below the control signal line voltage by the threshold voltage $V_t$.

As a further change relative to FIG. 3, the embodiment of FIG. 4A further employs the passive mode signal with an additional transistor 416 to directly switch the control current source 414 ON and OFF. By turning the control current source 414 OFF for the active mode, the embodiment of FIG. 4A uses the additional transistor 416 to limit the control transistor's sub-threshold leakage current $I_S$. The sub-threshold leakage current of transistor 416, $I_{S|416}$, can be made substantially smaller than that of the HV MOS control transistor 216. Moreover, if the additional transistor 416 is added in anti-series to mirror transistor 415 (i.e., if the drain of transistor 416 is coupled to the drain of mirror transistor 415), the gate-source voltage $V_{GS}$ of control transistor 216 becomes negative, further reducing the effective sub-threshold current of device 216.

Thus, in the embodiment of FIG. 4A, control transistor 216 as compensated provides a control current $I_{CTL}$ of $I_{PULL}$ when the passive mode signal is asserted and $I_{S|416}$ when the passive mode signal is de-asserted. With an appropriate placement of the threshold voltage for shunt transistor 202, the control device embodiment of FIG. 4A demonstrates an extended operating range relative to the embodiment of FIG. 3.

Figure 4B:
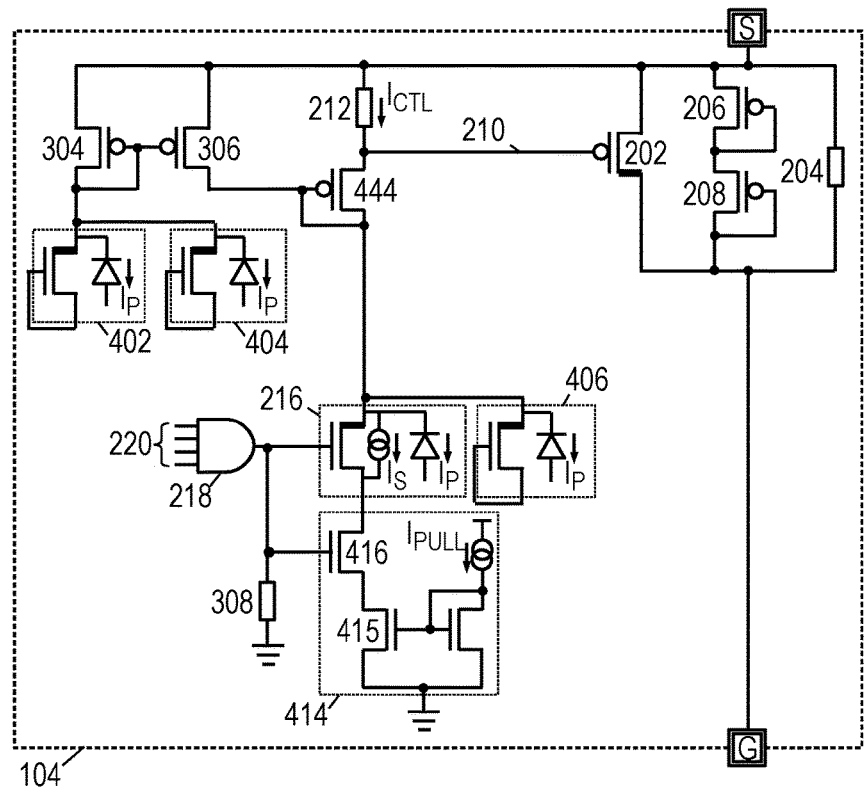
FIG. 4B is a schematic of an alternative switch control device embodiment.

With the tight operating margin that is present in the ultralow current regime, the embodiment of FIG. 4A may not always achieve adequate matching of the compensation current to the parasitic leakage current of control transistor 216, as there may be minor process variations even between adjacent transistors. FIG. 4B accordingly offers an alternative embodiment that enables better matching.

In the embodiment of FIG. 4B, compensation transistor 402 is coupled in parallel with a second compensation transistor 404. As with the first compensation transistor, the second also has a floating source shorted to its gate. The compensation transistors together set the compensation current source to provide a compensation current nominally matched to 2 $I_P$.

Figure 5:
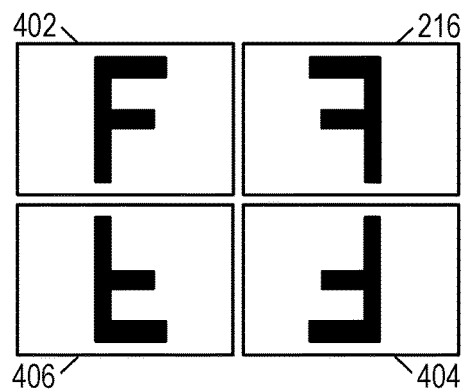
FIG. 5 shows a symmetric quad arrangement.

FIG. 4B further provides an additional transistor 406 having a floating source shorted to its gate. The drain is connected to the drain of the control transistor 216, also resulting in a nominal doubling of the parasitic leakage current. However, process variations may produce differences in the parasitic leakage currents of otherwise identical transistors. To compensate for such process variation, the four of the transistors 216, 402, 404, 406 are preferably arranged as a quad of identically-dimensioned transistors as shown in FIG. 5. (In FIG. 5, the asymmetric letter "F" is used as a proxy to demonstrate how the identically-dimensioned transistor layouts may be arranged symmetrically to maximize matching.) Further it is the diagonally-opposite portions of the quad that are combined. Thus, the compensation transistors 402 and 404 are on diagonally-opposite corners of the quad, while control transistor 216 and additional transistor 406 are on diagonally-opposite corners. This arrangement is sometimes called a "crossed quad" arrangement, and it serves to provide first-order compensation for variation along the x-axis and the y-axis and equalization of carrier injection from aggressor currents in the substrate.

The foregoing leakage compensation designs and techniques are suitable for ultralow current operation of HV MOS transistors in backup energy blocks and other control devices that may be required to provide control signals in the ultra low current regime. Though the disclosed configuration provides compensation to an n-type HV MOS transistor, those of ordinary skill will recognize the adaptability of the configuration to p-type HV MOS transistors, and indeed, to MOS transistors of all varieties. These and numerous other modifications, equivalents, and alternatives, will become apparent to those skilled in the art once the above disclosure is fully appreciated. It is intended that the following claims be interpreted to embrace all such modifications, equivalents, and alternatives where applicable.

What is claimed is:

1. A control device with ultralow current requirements, the device comprising:
   a control signal line;
   a control current source;
   a high-voltage metal-oxide-semiconductor ("HV MOS") control transistor that selectively couples the control current source to the control signal line, the control transistor further coupling a parasitic leakage current to the control signal line; and
   a compensation current source coupled to the control signal line to provide a compensation current, the compensation current source including an HV MOS compensation transistor that matches the compensation current to the parasitic leakage current.

2. The control device of claim 1, wherein the compensation transistor has a gate and a floating source shorted to the gate.

3. The control device of claim 2,
   wherein the compensation transistor has a drain coupled to a drain of a second compensation transistor having a gate and a floating source shorted to the gate of the second compensation transistor,
   wherein the control transistor has a drain coupled to a drain of an additional transistor having a gate and a floating source shorted to the gate of the additional transistor, and wherein the control transistor, the additional transistor, and both compensation transistors form a cross-quad arrangement to match the compensation current to the parasitic leakage current.

4. The control device of claim 1, wherein the control current source and the compensation current source each include a current mirror arrangement to increase their output impedance.

5. The control device of claim 4, further comprising a diode or other level-shifting component coupled between the control signal line and the compensation current source.

6. The control device of claim 1, wherein the control transistor and compensation transistor are matched enhancement mode n-type HV MOS transistors.

7. The control device of claim 6, wherein the control transistor couples the control current to the control signal line for normal device operation, and wherein the control transistor isolates the control current from the control signal line when the device loses power.

8. The control device of claim 6, wherein the control line is coupled to a power switch to open the power switch in a passive mode and to close the power switch in an active mode.

9. The control device of claim 8, wherein the power switch is an anti-series switch that, when closed, supplies power from a backup energy block.

10. The control device of claim 1, wherein the control current source provides a control current having a magnitude less than 250 nA.

11. An ultralow current control method that comprises:
   selectively coupling a control current source to a control signal line with an HV MOS control transistor that further couples a parasitic leakage current to the control signal line; and
   compensating for the parasitic leakage current with a compensation current
   source having an HV MOS compensation transistor that matches the compensation current to the parasitic leakage current.

12. The method of claim 11, wherein the control current source provides a control current having a magnitude less than 250 nA.

13. The method of claim 11, wherein said selectively coupling comprises isolating the control current source from the control signal line for an active mode, and further comprises coupling the control current source to the control signal line for a passive mode.

14. The method of claim 13, wherein the control line is coupled to a power switch to open the power switch in the passive mode and to close the power switch in the active mode.

15. The method of claim 14, further comprising supplying, via the power switch, power from a backup energy source.

16. The method of claim 11, wherein the control transistor and compensation transistor are matched enhancement mode n-type HV MOS transistors.

17. The method of claim 11, wherein the compensation transistor has a gate and a floating source shorted to the gate.

18. A backup energy block that comprises:
   a voltage regulator coupled to a pair of output terminals;
   a pair of input terminals that couple to a backup energy source;
   an anti-series switch that supplies power from the pair of input terminals to the voltage regulator (when closed) and isolates power from the pair of input terminals to the voltage regulator (when open);
   a control current source;
   a high-voltage metal-oxide-semiconductor ("HV MOS") control transistor that selectively couples the control current source to a control signal line to control the anti-series switch, the control transistor further coupling a parasitic leakage current to the control signal line; and
   a compensation current source coupled to the control signal line to provide a compensation current, the compensation current source including an HV MOS compensation transistor that matches the compensation current to the parasitic leakage current.

19. The backup energy block of claim 18, wherein the compensation transistor has a gate and a floating source shorted to the gate.

20. The backup energy block of claim 19, further comprising a diode or other level-shifting component coupled between the control signal line and the compensation current source.

* * * * *